US005550543A

United States Patent [19]

Chen et al.

[11] Patent Number: 5,550,543

[45] Date of Patent: Aug. 27, 1996

[54] FRAME ERASURE OR PACKET LOSS COMPENSATION METHOD

[75] Inventors: Juin-Hwey Chen, Neshanic Station, N.J.; Craig R. Watkins, Hamilton, Australia

[73] Assignee: Lucent Technologies Inc., Murray Hill, N.J.

[21] Appl. No.: 324,283

[22] Filed: Oct. 14, 1994

[51] Int. Cl.[6] .................................................. H03M 13/00

[52] U.S. Cl. ............................................. 341/94; 375/350

[58] Field of Search .............................. 341/94; 375/350, 375/241; 571/30

[56] References Cited

U.S. PATENT DOCUMENTS

| | | | |
|---|---|---|---|
| 4,375,581 | 3/1983 | Jayant | 375/241 |
| 5,450,559 | 9/1995 | Kroon | 375/350 |

FOREIGN PATENT DOCUMENTS

| | | | |
|---|---|---|---|
| 0532225A2 | 9/1992 | European Pat. Off. | G10L 5/00 |
| 0582921A2 | 7/1993 | European Pat. Off. | G10L 9/14 |

OTHER PUBLICATIONS

V. Cuperman, "Advances In Speech Coding For Wireless Communications," Proc. Sixth International Conf. On Wireless Communications (Wireless 94), Calgary, Canada, Jul. 1994.

Co-pending patent application, "Excitation Signal Synthesis During Frame Erasure Or Packet Loss," by J-H. Chen, Ser. No. 08/212,408, filed Mar. 14, 1994.

J-H, Chen et al., "A Low-Delay CELP Coder For The CCITT 16 kb/s Speech Coding Standard," *IEEE Journal Selected Areas in Communications,* 1992, pp. 830–849.

AT&T, "G. 728 Decoder Modification For Frame Erasure Concealment," Contribution to ITU-T SG XV/Q.5, Mar. 1994, pp. 1–13.

K. Zeger et al., "Psuedo-Gray Coding," *IEEE Trans. Communications,* 38(12), 1990, pp. 2147–2158.

V. K. Varma, "Testing Speech Coders For Usage In Wireless Communications Systems," *IEEE Workshop On Speech Coding For Telecommunications,* Quebec, Canada, 1993, pp. 93–94.

D. J. Goodman et al., "Waveform Substitution Techniques For Recovering Missing Speech Segments In Packet Voice Communications," *IEE Trans. Acoust., Speech, Signal Processing,* ASSP-34(6), 1986, pp. 1440–1448.

R. V. Cox et al., "Robust CELP Coders For Noisy Backgrounds and Noisy Channels," *Proc. International Conference On Acoustics, Speech, and Signal Processing,* Glasgow, Scotland, 1989, pp. 739–742.

(List continued on next page.)

*Primary Examiner*—Jeffrey A. Gaffin
*Assistant Examiner*—Jason L. W. Kost
*Attorney, Agent, or Firm*—Kenneth M. Brown

[57] ABSTRACT

A method and apparatus for improving the performance of coding systems in the presence of frame erasures or lost packets. The encoded signal is modified after transmission but prior to decoding by a decoder preprocessor. The preprocessor recognizes that a given frame has been corrupted and modifies the encoded signal so that the decoding thereof will result in improved coding system performance. Specifically, based on the decoding process and on a predetermined target signal, the encoded signal is modified so that the decoding thereof will generate an approximation to the target signal. In a first illustrative embodiment, a CELP speech coder is used and the target signal is an excitation signal comprised of all-zero excitation vectors. In this case, the portion of the corrupted excitation signal indices which identify the corresponding gain factors are set to values which represent a low gain factor. In a second illustrative embodiment, a CELP speech coder is used and the target signal comprises an extrapolation of the excitation signal represented by the encoded signal for one or more previous frames. In this case, the preprocessor encodes the extrapolated excitation signal using the best codebook matches available. In either case, the effect of corrupted frames in the reconstructed speech signal is minimized.

26 Claims, 2 Drawing Sheets

OTHER PUBLICATIONS

J–H. Chen, et al., "The Creation And evolution Of 16 kbit/s LD–Celp: From Concept To Standard," *Speech Communication,* 1993, pp. 103–111.

S. Crisafulli et al., "Kalman Filtering Techniques In Speech Coding," *Proc. IEEE international Conference On Acoustics, Speech, and Signal Processing* San Francisco, 1992, pp. I–77–I–80.

J. D. Gibson et al., "Filtering Of Colored Noise For Speech Enhancement And Coding," *IEEE Trans. Signal Processing,* 39(8), 1991, pp. 1732–1742.

J–H. Chen et al., "Convergence And Numerical Sensitivity Of Backward–Adaptive LPC Predictor," *IEEE Workshop On Speech Coding For Telecommunications,* Quebec, Canada, 1993, pp. 83–84.

Y. Tohkura et al., "Spectral Smoothing Technique In PARCOR Speech Analysis–Synthesis," *IEEE Trans. Acous., Speech, Signal Processing,* ASSP–26, 1978, pp. 587–596.

AT&T, "A Solution For The P50 Problem:," *Contribution To CCITT SG XV/Q.21,* 1992, pp. 1–7.

FRAME ERASURE OR PACKET LOSS COMPENSATION METHOD

FIELD OF THE INVENTION

The present invention relates generally to speech coding arrangements for use in wireless communication systems or communications systems based on packet-switched networks, and more particularly to the ways in which such speech coders function in the event of burst-like errors or lost packets, respectively.

BACKGROUND OF THE INVENTION

Many communication systems, such as cellular telephone and personal communications systems, rely on wireless channels to communicate information. In the course of communicating such information, wireless communication channels can suffer from several sources of error, such as multipath fading. These error sources can cause, among other things, the problem of frame erasure. An erasure refers to the total loss or substantial corruption of a set of bits communicated to a receiver. A frame is a predetermined fixed number of bits which the communication system treats as a single entity for purposes of communication.

If a frame of bits is totally lost, then the receiver has no bits to interpret. Under such circumstances, the receiver may produce a meaningless result. If a frame of received bits is corrupted and therefore unreliable, the receiver may produce a severely distorted result.

As the demand for wireless system capacity has increased, a need has arisen to make the best use of available wireless system bandwidth. One way to enhance the efficient use of system bandwidth is to employ a signal compression technique. For wireless systems which carry speech signals, speech compression (or speech coding) techniques may be employed for this purpose. Such speech coding techniques include analysis-by-synthesis speech coders, such as the well-known code-excited linear prediction (or CELP) speech coder.

The problem of packet loss in packet-switched networks employing speech coding arrangements is very similar to frame erasure in the wireless context. That is, due to packet loss, a speech decoder may either fail to receive a frame or receive a frame having a significant number of missing bits. In either case, the speech decoder is presented with the same essential problem— the need to synthesize speech despite the loss of compressed speech information. Both "frame erasure" and "packet loss" concern a communication channel (or network) problem which causes the loss of transmitted bits. For purposes of this description, therefore, the term "frame erasure" may be deemed synonymous with packet loss.

CELP speech coders employ a codebook of excitation signals to encode an original speech signal. These excitation signals are used to "excite" a linear predictive (LPC) filter which synthesizes a speech signal (or some precursor to a speech signal) in response to the excitation. The synthesized speech signal is compared to the signal to be coded. The codebook excitation signal which most closely matches the original signal is identified. The identified excitation signal's codebook index is then communicated to a CELP decoder. (Depending upon the type of CELP system, other types of information may be communicated as well.) The decoder contains a codebook identical to that of the CELP encoder. The decoder uses the transmitted index to select an excitation signal from its own codebook. This selected excitation signal is used to excite the decoder's LPC filter. Thus excited, the LPC filter of the decoder generates a decoded (or quantized) speech signal (referred to herein as the "reconstructed speech signal")— the same speech signal which was previously determined to be closest to the original speech signal.

One particular CELP coding system is the well-known 16 kbit/s low-delay CELP (LD-CELP) speech coding system adopted by the CCITT as its international standard known as "Recommendation G.728." In this system,/br example, the 1024-entry (i.e., 10-bit) codebook is decomposed into two smaller codebooks— a 7-bit "shape codebook" containing 128 independent codevectors and a 3-bit "gain codebook" containing 8 scalar values. The former codebook's codevectors represent the shape of the excitation signal whereas the latter codebook's values represent a gain factor which is to be applied to these codevectors. Thus, the excitation signal index which is transmitted to the decoder comprises two parts— one which identifies the codevector to be retrieved from the corresponding shape codebook found in the decoder (a 7-bit index), and one which identifies a gain factor to be applied thereto (a 3-bit index). In a G.728 CELP coding system, such a (10-bit) excitation signal index is transmitted for each set of five contiguous speech samples, the speech samples having been sampled at a rate of 8 kHz. This set of five samples is known as a "vector." Each frame comprises a fixed number of such "vectors"(e.g., 16).

Systems which employ speech coders may be more sensitive to the problem of frame erasure than those systems which do not compress speech. This sensitivity is due to the reduced redundancy of coded speech (compared to uncoded speech) making the possible loss of each communicated bit more significant. In the context of a CELP speech coder experiencing frame erasure, excitation signal codebook indices may be either lost or substantially corrupted. Because of erased frames, the decoder will not be able to reliably identify which entries in its codebook should be used to synthesize speech. As a result, speech coding system performance may degrade significantly.

Most prior attempts to rectify the problem of frame erasure have required that either the speech decoder or both the speech decoder and the speech encoder be modified to improve the performance of the system in the presence of such erasures. However, when a standardized coding system such as G.728 is employed, it may not be possible or desirable to modify these components. This is particularly true in the case where standard "off-the-shelf" components are used to implement the encoder and decoder. For example, if a standard coding system such as G.728 is implemented with VLSI (Very Large Scale Integration) ASIC (Application-Specific Integrated Circuit) chips, it is not possible to modify the decoder or the encoder and yet still make use of these chips. Alternatively, if the coding system is implemented with a general purpose processor such as a DSP (digital signal processor), but the decoder and encoder program code consist of vendor-supplied software provided only in object code (as opposed to source code) form, it may not be possible to modify the program code to alter the behavior of the decoder or the encoder.

SUMMARY OF THE INVENTION

The present invention improves the performance of coding systems in the presence of frame erasures without requiring that modifications be made to either the speech encoder or the speech decoder. A decoder preprocessor may be used to advantageously modify an encoded signal (i.e., a signal which has been compressed by an encoder) after transmission but prior to decoding. The preprocessor recognizes that a given frame has been corrupted and modifies the encoded signal so that the decoding thereof will produce a superior reconstructed signal than would otherwise have been generated by the decoder.

Specifically, the encoded signal is modified based on knowledge of the decoding process and based on a predetermined signal (referred to herein as the "target signal"), so that the decoder, when provided with the modified signal, will generate an approximation to the predetermined target signal. Advantageously, a predetermined target signal is chosen, which, if it were available to the decoder, would improve the quality of the reconstructed signal generated by the decoder. Thus, the use of the modified signal will improve the quality of the reconstructed signal, since the decoder will be enabled to generate an approximation to the target signal. (By "approximation" it is meant that the decoder will generate a signal that is close enough to the target signal so that the resultant reconstructed signal provides an enhanced performance of the coding system as compared to the operation of the system in the absence of the modification. As is well known to those of ordinary skill in the art, the perceptual quality of a reconstructed signal is routinely assessed based on objective measures, such as the "Mean Opinion Score" index.)

In a first illustrative embodiment, for example, a CELP speech coder is used and the target signal is chosen to be an excitation signal comprised of all-zero excitation vectors. In this embodiment, the excitation signal indices for the erased frame are advantageously modified by the preprocessor to ensure that the decoding thereof will result in the generation of excitation signals having low energy— that is, approximating the target signal (i.e., the all-zero excitation vectors). Specifically, when a frame has been recognized as corrupted, the portion of the transmitted excitation signal index which identifies the gain factor (i.e., the index of the gain codebook) for each vector of the frame is set to a value which identifies the gain factor having the lowest possible absolute value. In this manner, the effect of corrupted frames in the reconstructed speech signal is minimized.

In a second illustrative embodiment, a CELP coder is used and the target signal is chosen to be an excitation signal comprising an extrapolation of the excitation signal represented by the encoded signal for one or more previous frames. In this embodiment, the preprocessor "decodes" the encoded speech signal of non-erased frames to the extent necessary to generate the excitation signal that will also be generated within the decoder. In other words, the preprocessor performs codebook "lookups" in the same manner as the decoder. Then, when an erased frame is recognized, the preprocessor extrapolates the "decoded" excitation signal of the previous frame forward through the time period of the erased frame. The preprocessor encodes the extrapolated excitation signal using the best codebook matches available, by performing a series of codebook "searches." Specifically, the codebook vectors which best match each vector of the extrapolated excitation signal are chosen. The preprocessor then identifies the indices representing the best codebook vectors and employs these indices to produce a modified encoded speech signal. This modified signal enables the decoder to approximate the target signal (i.e., the extrapolated excitation signal), thereby minimizing the effect of corrupted frames in the reconstructed speech signal.

DETAILED DESCRIPTION

A. Introduction

The present invention concerns, for example, the operation of a speech coding system experiencing frame erasure— that is, the loss of a group of consecutive bits in the compressed bit-stream which group is ordinarily used to synthesize speech. The description which follows concerns features of the present invention applied illustratively to the well-known 16 kbit/s low-delay CELP (LD-CELP) speech coding system adopted by the CCITT as its international standard— Recommendation G.728.

The operation of the G.728 standard is described in detail in co-pending patent application, "Excitation Signal Synthesis During Frame Erasure or Packet Loss," by J-H. Chen, Ser. No. 08/212,408, filed on Mar. 14, 1994, and assigned to the assignee of the present invention. (The draft recommendation which was adopted as the G.728 standard is attached thereto as an Appendix. The draft will be referred to herein as the "G.728 standard draft." It includes detailed descriptions of the speech encoder and decoder of the standard in sections 3 and 4 thereof.) Pat. application Ser. No. 08/212,408 is hereby incorporated by reference as is fully set forth herein. The description of the G.728 standard notwithstanding, those of ordinary skill in the art will appreciate that features of the present invention have applicability to other coding systems as well.

B. Overview

Figure 1:
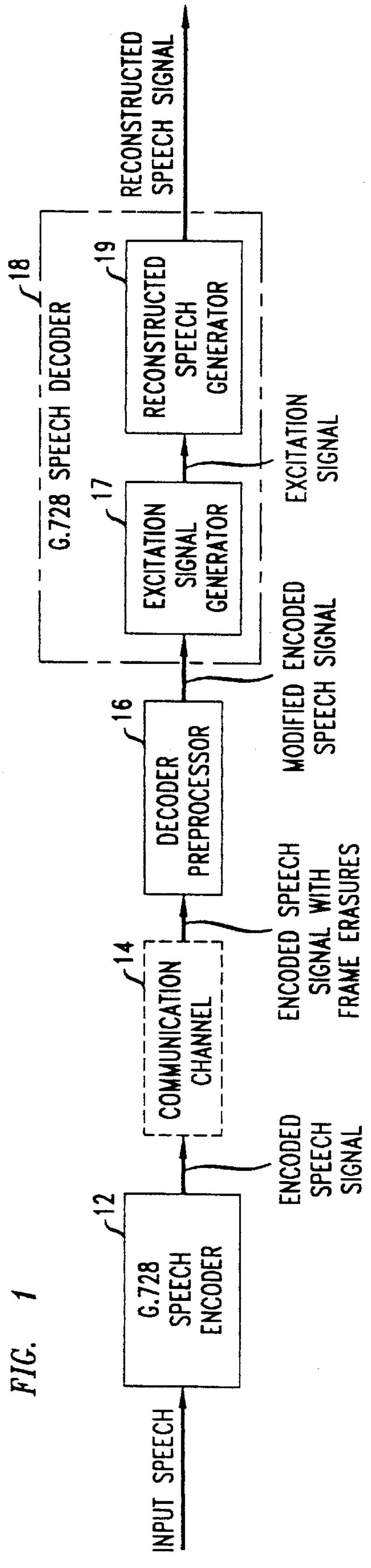
FIG. 1 presents an illustrative wireless communication system in accordance with the present invention.

FIG. 1 presents an illustrative wireless communication system in accordance with the present invention. Encoder 12 comprises a conventional G.728 LD-CELP encoder and decoder 18 comprises a conventional G.728 LD-CELP decoder. Decoder 18 comprises excitation signal generator 17 and reconstructed speech generator 19. Channel 14 comprises a conventional communication channel which includes the possibility of data corruption of the encoded signals transmitted therethrough. Channel 14 illustratively may be a wireless communication channel or a packet-switched network. Decoder preprocessor 16, based on the recognition of erased (i.e., corrupted) frames, modifies the encoded speech signal in accordance with an illustrative embodiment of the present invention, thereby improving the coding system's performance in the presence of frame erasures.

In operation, input speech to be coded is supplied to encoder 12 which produces an encoded speech signal for transmission through channel 14. The resultant encoded speech signal received at the "far" end of channel 14 may contain frame erasures. Ultimately, decoder 18 produces a reconstructed speech signal, which attempts to reproduce as faithfully as possible the input speech originally provided to encoder 12. In particular, excitation signal generator 17 of decoder 18 first generates an excitation signal by performing codebook lookups based on the encoded speech signal (i.e., the codebook indices) provided thereto. Then, based on this excitation signal, reconstructed speech generator 19 generates the reconstructed speech signal.

In "normal" operation (i.e., without experiencing frame erasure) decoder 18 operates on the original encoded speech signal as produced by encoder 12, communicated through channel 14, and received by preprocessor 16. In other words, when preprocessor 16 determines that the encoded speech signal for a given frame is valid (i.e., has not been corrupted by virtue of its communication through channel 14), it passes the signal unmodified to decoder 18.

As described above and in the G.728 standard draft, the encoded speech signal comprises codebook indices. Each index represents a vector of five excitation signal samples which may be obtained from the (identical) excitation codebook found in both encoder 12 and excitation signal generator 17 of decoder 18. Each codebook (i.e., the encoder codebook and the decoder codebook) comprises separate gain and shape codebooks. The 3-bit indexed gain codebook comprises 8 signed scalar entries and the 7-bit indexed shape codebook comprises 128 (5-sample) codevector entries. The scalar values of the gain codebook are symmetric with respect to zero and comprise one bit (i.e., the most significant bit) to represent the sign and two bits (i.e., the two least significant bits) to represent the magnitude of the value. The overall 10-bit index comprised in the encoded signal represents the "product" of the identified codevector from the shape codebook and the identified gain factor from the gain codebook.

The decoder uses each received index to extract an excitation codevector from its codebook. The extracted codevector is the one which was determined by the encoder to be the best match with the original signal. Specifically, the received index comprises two pans— a shape codebook index and a gain codebook index. The excitation codevector ultimately extracted by the decoder is the product of the extracted shape codevector (from the 7-bit shape codebook) and the extracted gain level (from the 3-bit gain codebook). (Note that according to the G.728 standard, the decoded signal is further scaled by a backward-adaptive vector gain. This gain-scaling process is performed in addition to, but separate and apart from, the use of the gain factor extracted from the gain codebook as described above. With reference to the system illustrated in FIG. 1, for example, the backward-adaptive gain-scaling is performed as part of reconstructed speech generator 19, while the multiplication of the extracted shape codevector by the gain factor extracted from the gain codebook is performed as part of excitation signal generator 17.)

In the presence of frame erasures, preprocessor 16 of FIG. 1 does not receive reliable information (if it receives anything at all) concerning which vectors of excitation signal samples should be extracted from the codebook of excitation signal generator 17 of decoder 18. Thus, were preprocessor 16 to pass the encoded speech signal unmodified to decoder 18 (or, equivalently, were preprocessor 16 not present in the system of FIG. 1 ), the resultant speech signal for corrupted frames would be generated based on an essentially arbitrary (i.e., random) selection of excitation codevectors. Such a random selection of codevectors often results in extremely severe perceptual distortions, typically appearing as many large magnitude, but short duration, "explosions." Although such errors can make listening to the reconstructed speech almost painful, it is still often mostly intelligible, even for frame erasure frequencies of up to 20%. Even for frame erasure rates as low as 1%, listening to the resultant reconstructed speech signal is often unpleasant.

C. A First Illustrative Embodiment

Figure 2:
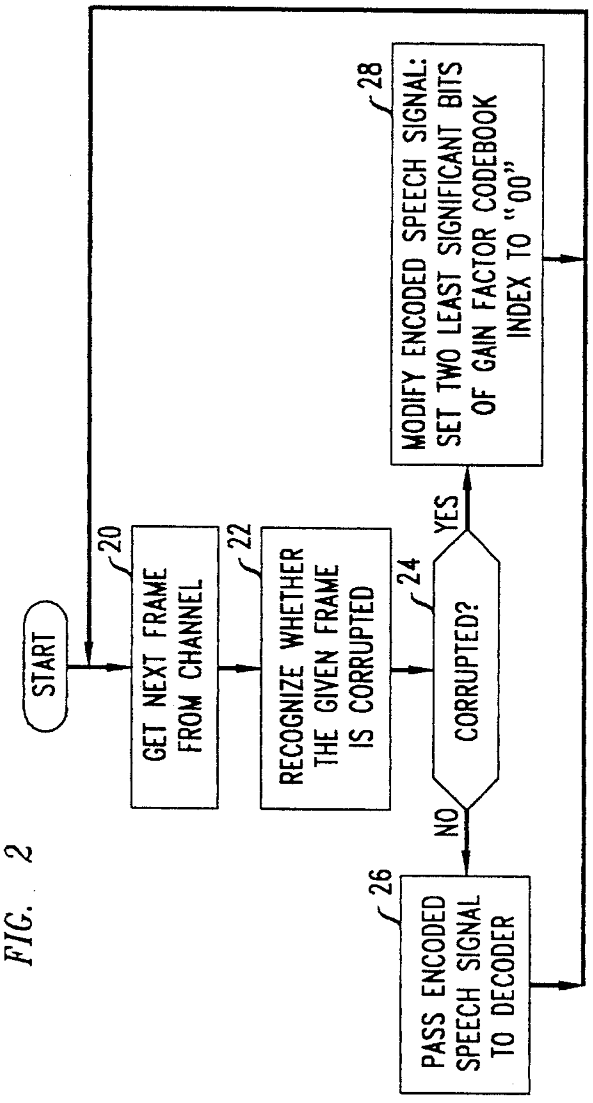
FIG. 2 presents a flow diagram of a first illustrative embodiment of the decoder preprocessor of FIG. 1.

FIG. 2 presents a flow diagram of a first illustrative embodiment of the decoder preprocessor of FIG. 1. In this embodiment, a CELP speech coder (e.g., the G.728 standard) is used and the target signal comprises all-zero excitation vectors. The preprocessor enables the decoder to approximate that target signal by modifying the erased frames of the encoded speech signal by setting the corresponding gain factors to a low value. Specifically, it sets the gain codebook index for erased frames to an index which represents a gain factor of the lowest possible absolute value.

Referring to FIG. 2, for each frame received from channel 14 (step 20), preprocessor 16 determines whether the encoded speech signal for that frame has been corrupted (step 22) or not corrupted. The determination that a given frame has been corrupted may be reached in any of numerous conventional ways well known in the art. For example, frame erasures may be detected through the use of a conventional error detection code. Moreover, such a code could be implemented, for example, as part of a conventional radio transmission/reception subsystem of a wireless communication system (which may, for example, be included as a part of channel 14), rather than as part of preprocessor 16. Similarly, such an error detection code could be implemented as pan of a network protocol interface subsystem in a packet-switched network environment. Thus, the determination as to whether a given frame is corrupted or not corrupted may be performed within preprocessor 16, or, alternatively, such information may be provided to the preprocessor from an external source. In either case, preprocessor 16 recognizes whether a frame erasure has occurred or not.

If the given frame is determined to be uncorrupted (decision 24), preprocessor 16 passes the encoded speech signal unmodified to decoder 18 as described above (step 26). If, on the other hand, preprocessor 16 recognizes that a given frame has been corrupted, the encoded speech signal is modified to ensure that the decoding of the modified signal for that frame will result in excitation signals having low energy (thereby approximating all-zero excitation vectors). Specifically, for each vector in the corrupted frame, the portion of the transmitted excitation signal index which identifies the gain factor (i.e., the index of the gain codebook) is set to a value which represents a low gain factor (i.e., a gain factor having the smallest possible absolute value).

According to the G.728 standard, for example, the gain codebook contains gain factors having the smallest possible absolute value at array index "1," which is equivalent to channel index "0," and at array index "5," which is equivalent to channel index "4" (see, e.g., G.728 standard draft, Annex B). Thus, in the illustrative embodiment of FIG. 2, the gain factor index for each vector in the corrupted frame is modified so that the least significant two bits of the 3-bit gain codebook index are set to "00" (step 28), thereby identifying either channel index "0" or channel index "4." Note that to avoid undesirable periodicity in the excitation signal, it is advantageous that the other bits of the excitation signal index— namely, the most significant bit of the three-bit gain codebook index (which reflects the sign of the gain) and the seven-bit shape codebook index— have effectively random values. Either such random values may be explicitly applied to these bits, or, alternatively, these bits may be left unmodified on the (reasonable) presumption that they will naturally be sufficiently random. Finally, after preprocessor 16 has either passed the encoded speech signal through to decoder 18 in step 26, or modified the encoded speech signal in accordance with the above description in step 28, control returns to step 20 for receipt of the next frame.

D. A Second Illustrative Embodiment

Figure 3:
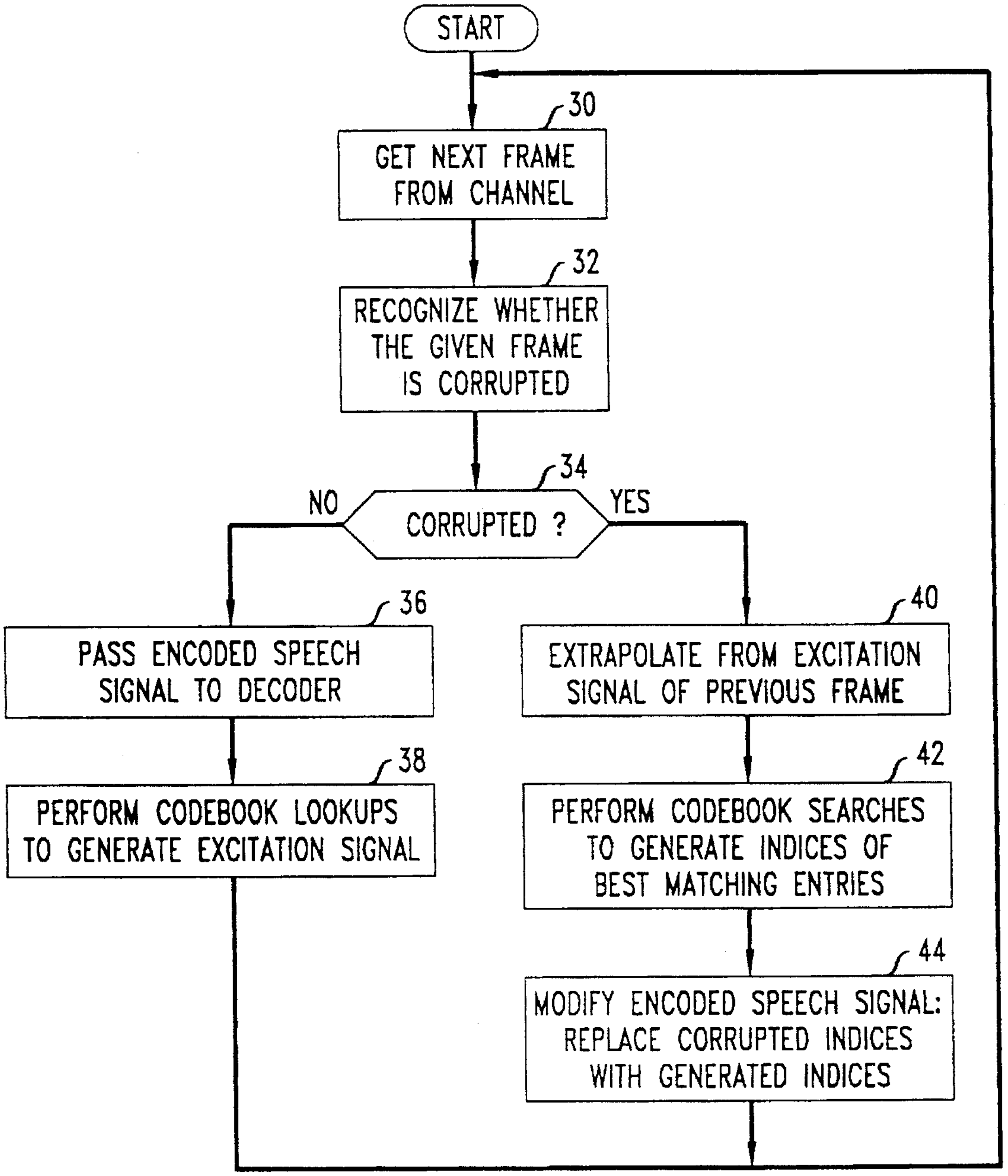
FIG. 3 presents a flow diagram of a second illustrative embodiment of the decoder preprocessor of FIG. 1.

FIG. 3 presents a flow diagram of a second illustrative embodiment of the decoder preprocessor of FIG. 1. In this embodiment, a CELP speech coder (e.g., the G.728 standard) is used and the target signal is chosen to be an excitation signal comprising an extrapolation of the excitation signal represented by the encoded signal for the previous frame. The preprocessor "decodes" the encoded speech signal of non-erased frames to the extent necessary to generate the excitation signal— that is, it performs the same codebook lookups that are performed within excitation signal generator 17 of the decoder. Preprocessor 16, therefore, advantageously contains a copy of the same codebook that is found in both the encoder and the decoder. When an erased frame is recognized, preprocessor 16 extrapolates the excitation signal that it decoded for the previous frame forward through the time period of the erased frame. Then, the preprocessor performs codebook searches to produce (the best matching) codebook indices which represent the extrapolated excitation signal.

Specifically and with reference to FIG. 3, for each frame received from channel 14 (step 30), preprocessor 16 determines whether the encoded speech signal for that frame has been corrupted (step 32) or not corrupted. Step 32 corresponds to step 22 of the flow diagram of FIG. 2, and may be performed in any of the conventional ways, as mentioned above.

If the given frame is determined to be uncorrupted (decision 34), preprocessor 16 passes the encoded speech signal unmodified to decoder 18 (step 36). In addition, preprocessor 16 performs codebook lookups for each codebook index contained in the given frame, generating and storing the resultant excitation signal. This process is essentially identical to that performed by excitation signal generator 17 of decoder 18 as shown in FIG. 1 and described above. This stored data is saved for possible use in the processing of the next frame (if the next frame turns out to be an erased frame).

If, on the other hand, preprocessor 16 recognizes in decision 34 that a given frame has been corrupted, steps 40 to 44 serve to modify the encoded speech signal to ensure that the decoding of the modified signal for that frame will approximate an extrapolation of the excitation signal stored in the processing of the previous frame. Specifically, step 40 first performs an extrapolation of the previous frame's excitation signal (which was decoded and stored in step 38). Such an extrapolation may be performed with use of conventional extrapolation techniques well known to those skilled in the art. For one approach to such an extrapolation, see, e.g., section II.A of the detailed description portion of patent application Ser. No. 08/212,408, which has been incorporated by reference herein.

Next, step 42 performs the "encoding" of the extrapolated excitation signal— that is, codebook searches are performed to find the codebook entries which provide the best match to the extrapolated signal. For each vector of the erased frame, the codebook is searched to find the entry which best matches the corresponding portion of the extrapolated excitation signal. The best match criterion may, for example, be based on a mean squared error measurement or other error criteria well known to those skilled in the art.

Finally, step 44 replaces the erased frame portion of the encoded speech signal with the codebook indices generated in step 42. The use of these codebook indices will enable the decoder to generate an excitation signal which approximates the extrapolated excitation signal generated in step 40, thereby enhancing the performance of the coding system. After preprocessor 16 has either passed the encoded speech signal through to decoder 18 in step 36 (and generated the excitation signal in step 38), or modified the encoded speech signal in accordance with the above description in steps 40 to 44, control returns to step 30 for receipt of the next frame.

E. Other Embodiments

For clarity of explanation, the illustrative embodiments of the present invention described herein have been presented as comprising individual functional blocks. The functions these blocks represent may be provided through the use of either shared or dedicated hardware, including, but not limited to, hardware capable of executing software. For example, the blocks presented in FIG. 1 may be provided by one or more processors. (Use of the term "processor" should not be construed to refer exclusively to hardware capable of executing software.)

Illustrative embodiments may comprise digital signal processor (DSP) hardware, such as the AT&T DSP16 or DSP32C, read-only memory (ROM) for storing software performing the operations discussed above, and random access memory (RAM) for storing DSP results. Very large scale integration (VLSI) hardware embodiments, as well as custom VLSI circuitry in combination with a general purpose DSP circuit, may also be provided.

Although specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention.

For example, while the present invention has been described in the context of the G.728 LD-CELP speech coding standard, the principles of the invention may be applied to other speech coding systems as well. For example, such coding systems may include a long-term predictor (or long-term synthesis filter) for converting a gain-scaled excitation signal to a signal having pitch periodicity. In addition, such a coding system may or may not include a postfilter. Moreover, the present invention may be applied to the coding of signals other than speech signals including audio, image and video signals.

In certain CELP speech coding systems, encoded parameters other than codebook indices, including, for example, LPC (linear predictive) filter coefficients and/or pitch prediction parameters, may be transmitted in addition to the codebook indices. The principles of the present invention may be advantageously applied to the case of frame erasure in the context of these systems as well. For example, if such encoded parameters are included in an erased frame, a target signal comprising an extrapolation of these parameters' values based on one or more previous (e.g., non-erased) frames may be advantageously used. As in the case of the extrapolation of excitation signals as described above, such an extrapolation may be performed with use of conventional extrapolation techniques well known to those skilled in the art. For one approach to such an extrapolation as applied to LPC coefficients, see, e.g., section II.B of the detailed description portion of patent application Ser. No. 08/212,408, which has been incorporated by reference herein.

In addition, a target signal comprising an interpolation (rather than an extrapolation) of signals such as excitation signals or parameter signals may be used in the context of the present invention without departing from the spirit or scope thereof. In this case, one or more (non-erased) frames subsequent to the erased frame, in addition to one or more frames prior to the erased frame, may be used to determine the target signal. Of course, in order to make use of subsequent frames, an additional delay must be incurred since those frames must be received before the current erased frame can be processed. Other similar or related embodiments of the present invention will be obvious to those of ordinary skill in the art.

We claim:

1. A method of enhancing the performance of a coding system, the coding system including a decoder which performs a decoding process in response to an encoded signal, the encoded signal comprising a plurality of frames, at least one of the frames of the encoded signal having experienced frame erasure, the method comprising the steps of:

recognizing that a given one of the frames of the encoded signal has experienced frame erasure; and modifying the encoded signal for the given frame, based on the decoding process and on a predetermined signal, to enable the decoder to generate a signal which approximates the predetermined signal in response to the modified encoded signal, wherein the given frame comprises an encoded gain signal representing a gain factor, and wherein the step of modifying the encoded signal comprises replacing the encoded gain signal with a different encoded gain signal, the different encoded gain signal representing it gain factor having a smaller absolute value than the gain factor represented by the replaced encoded gain signal.

2. The method of claim 1 wherein the encoded gain signal comprises a codebook index.

3. The method of claim 2 wherein the encoded signal conforms to the G.728 LD-CELP standard.

4. The method of claim 1 wherein the step of recognizing that the given frame has experienced frame erasure comprises detecting the occurrence of the frame erasure based on an analysis of the encoded signal for the given frame.

5. The method of claim 1 further comprising the step of decoding the modified encoded signal to produce a reconstructed signal.

6. The method of claim 1 wherein the encoded signal comprises an encoded speech signal.

7. A method of enhancing the performance of a coding system, the coding system including a decoder which performs a decoding process in response to an encoded signal, the encoded signal comprising a plurality of frames, at least one of the frames of the encoded signal having experienced frame erasure, the method comprising the steps of:

recognizing that a given one of the frames of tile encoded signal has experienced frame erasure; and modifying the encoded signal for the given frame, based on the decoding process and on a predetermined signal, to enable the decoder to generate a signal which approximates the predetermined signal in response to the modified encoded signal, wherein the predetermined signal is based on one or more of the frames previous to the given frame, wherein each frame comprises one or more excitation-indicating signals, each of the excitation-indicating signals representing an excitation signal, and wherein the step of modifying the encoded signal comprises the steps of:

determining the excitation signals represented by the excitation-indicating signals of one or more of the frames previous to the given frame;

generating one or more derived excitation signals for the given frame based on the determined excitation signals;

generating one or more derived excitation-indicating signals based on the one or more derived excitation signals; and replacing the one or more excitation-indicating signals of the given frame with the one or more derived excitation-indicating signals.

8. The method of claim 7 wherein the excitation-indicating signals and the derived excitation-indicating signals comprise codebook indices.

9. The method of claim 8 wherein the step of determining the excitation signals comprises performing one or more codebook lookups, and wherein the step of generating the derived excitation-indicating signals comprises performing one or more codebook searches.

10. The method of claim 9 wherein the encoded signal conforms to the G.728 LD-CELP standard.

11. The method of claim 7 wherein the step of recognizing that the given frame has experienced frame erasure comprises detecting the occurrence of the frame erasure based on an analysis of the encoded signal for the given frame.

12. The method of claim 7 further comprising the step of decoding the modified encoded signal to produce a reconstructed signal.

13. The method of claim 7 wherein the encoded signal comprises an encoded speech signal.

14. The method of claim 7 wherein the step of generating one or more derived excitation signals for the given frame comprises extrapolating from the determined excitation signals represented by the excitation-indicating signals of the one or more frames previous to the given frame.

15. A decoder preprocessor for enhancing the performance of a coding system, the coding system including a decoder which performs a decoding process in response to an encoded signal, the encoded signal comprising a plurality of frames, at least one of the frames of the encoded signal having experienced frame erasure, the decoder preprocessor comprising:

means for recognizing that a given one of the frames of the encoded signal has experienced frame erasure; and means for modifying the encoded signal for the given frame, based on the decoding process and on a predetermined signal, to enable the decoder to generate a signal which approximates the predetermined signal in response to the modified encoded signal, wherein the given frame comprises an encoded gain signal representing a gain factor, and wherein the means for modifying the encoded signal comprises means for replacing the encoded gain signal with a different encoded gain signal, the different encoded gain signal representing a gain factor having a smaller absolute value than the gain factor represented by the replaced encoded gain signal.

16. The decoder preprocessor of claim 15 wherein the encoded gain signal comprises a codebook index.

17. The decoder preprocessor of claim 16 wherein the encoded signal conforms to the G.728 LD-CELP standard.

18. The decoder preprocessor of claim 15 wherein the means for recognizing that the given frame has experienced frame erasure comprises means for detecting the occurrence of the frame erasure based on an analysis of the encoded signal for the given frame.

19. The decoder preprocessor of claim 15 wherein the encoded signal comprises an encoded speech signal.

20. A decoder preprocessor for enhancing the performance of a coding system, the coding system including a decoder which performs a decoding process in response to an encoded signal, the encoded signal comprising a plurality of frames, at least one of the frames of the encoded signal having experienced frame erasure, the decoder preprocessor comprising:

means for recognizing that a given one of the frames of the encoded signal has experienced frame erasure; and means for modifying the encoded signal for the given frame, based on the decoding process and on a predetermined signal, to enable the decoder to generate a signal which approximates the predetermined signal in response to the modified encoded signal, wherein the predetermined signal is based on one or more of the frames previous to the given frame, wherein each frame comprises one or more excitation-indicating signals, each of the excitation-indicating signals representing an excitation signal, and wherein the means for modifying the encoded signal comprises:

means for determining the excitation signals represented by the excitation-indicating signals of one or more of the frames previous to the given frame;

means for generating one or more derived excitation signals for the given frame based on the determined excitation signals;

means for generating one or more derived excitation-indicating signals based on the one or more derived excitation signals; and means for replacing the one or more excitation-indicating signals of the given frame with the one or more derived excitation-indicating signals.

21. The decoder preprocessor of claim 20 wherein the excitation-indicating signals and the derived excitation-indicating signals comprise codebook indices.

22. The decoder preprocessor of claim 21 wherein the means for determining the excitation signals comprises means for performing one or more codebook lookups, and wherein the means for generating the derived excitation-indicating signals comprises means for performing one or more codebook searches.

23. The decoder preprocessor of claim 22 wherein the encoded signal conforms to the G.728 LD-CELP standard.

24. The decoder preprocessor of claim 20 wherein the means for recognizing that the given frame has experienced frame erasure comprises means for detecting the occurrence of the frame erasure based on an analysis of the encoded signal for the given frame.

25. The decoder preprocessor of claim 20 wherein the encoded signal comprises an encoded speech signal.

26. The decoder preprocessor of claim 20 wherein the means for generating one or more derived excitation signals for the given frame comprises means for extrapolating from the determined excitation signals represented by the excitation-indicating signals of the one or more frames previous to the given frame.

* * * * *